US008060313B2

(12) United States Patent
Takeuchi

(10) Patent No.: US 8,060,313 B2
(45) Date of Patent: Nov. 15, 2011

(54) SIMULATION SYSTEM USING ELECTROMAGNETIC FIELD ANALYSIS AND CIRCUIT ANALYSIS AND RECORDING MEDIUM STORING SIMULATION PROGRAM

(75) Inventor: Atsushi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/490,510

(22) Filed: Jun. 24, 2009

(65) Prior Publication Data

US 2009/0259452 A1 Oct. 15, 2009

Related U.S. Application Data

(63) Continuation of application No. PCT/JP2006/326251, filed on Dec. 28, 2006.

(51) Int. Cl.
*G06F 17/50* (2006.01)
*G01R 15/00* (2006.01)

(52) U.S. Cl. ........................................ 702/14; 702/57

(58) Field of Classification Search .................. 703/4, 5, 703/14; 702/57

See application file for complete search history.

(56) References Cited

U.S. PATENT DOCUMENTS

| | | | | |
|---|---|---|---|---|
| 6,219,629 | B1 | 4/2001 | Namiki | 703/13 |
| 7,027,941 | B2 * | 4/2006 | Nagase et al. | 702/66 |
| 7,236,895 | B2 * | 6/2007 | Sagesaka et al. | 702/57 |

FOREIGN PATENT DOCUMENTS

| | | |
|---|---|---|
| JP | 7-141312 | 6/1995 |
| JP | 11-153634 | 6/1999 |
| JP | H11-153634 A | 6/1999 |
| JP | 2003-223426 | 8/2003 |
| JP | 2004-54642 | 2/2004 |
| JP | 2004-054642 A | 2/2004 |
| JP | 2006-133994 | 5/2006 |

OTHER PUBLICATIONS

Partial English-language Translation of JP-2004-54642-A. (JP-2004-54642-A was previously submitted in an IDS filed on Jun. 24, 2009 along with an English-language Abstract).

Pongpaibool, P. et al., *An Alternating Implicit Block Overlapped FDTD (AIBO-FDTD) Method and Its Estimation with Parallel Computation*, 2001 IEEE, pp. 185-188.

Watanabe, T. et al., *Parallel-Distributed FDTD-Based Full-Wave Simulator for Large-Scale Printed Wiring Boards*, 2002 IEEE, pp. 287-290.

International Search Report and Written Opinion, mailed Jan. 30, 2007, in corresponding International Application No. PCT/JP2006/326251 (10 pp. including translation).

International Preliminary Report on Patentability, mailed Jul. 9, 2009, in corresponding PCT App. No. PCT/JP2006/326251 (13 pp.).

* cited by examiner

*Primary Examiner* — Paul Rodriguez
*Assistant Examiner* — Eun Kim
(74) *Attorney, Agent, or Firm* — Fujitsu Patent Center

(57) ABSTRACT

A simulation system includes electromagnetic field analyzing units that execute electromagnetic field analysis with respect to electromagnetic field analysis areas obtained by division of an area to be analyzed into the electromagnetic field analysis areas; one or more circuit analyzing units that execute circuit analysis with respect to a circuit unit in the area to be analyzed; and an aggregating unit that aggregates, from the electromagnetic field analyzing units, data for the circuit analysis by the one or more circuit analyzing units and transmits the data to the circuit analyzing units. The simulation system links plural processing units that mutually exchange data.

20 Claims, 13 Drawing Sheets

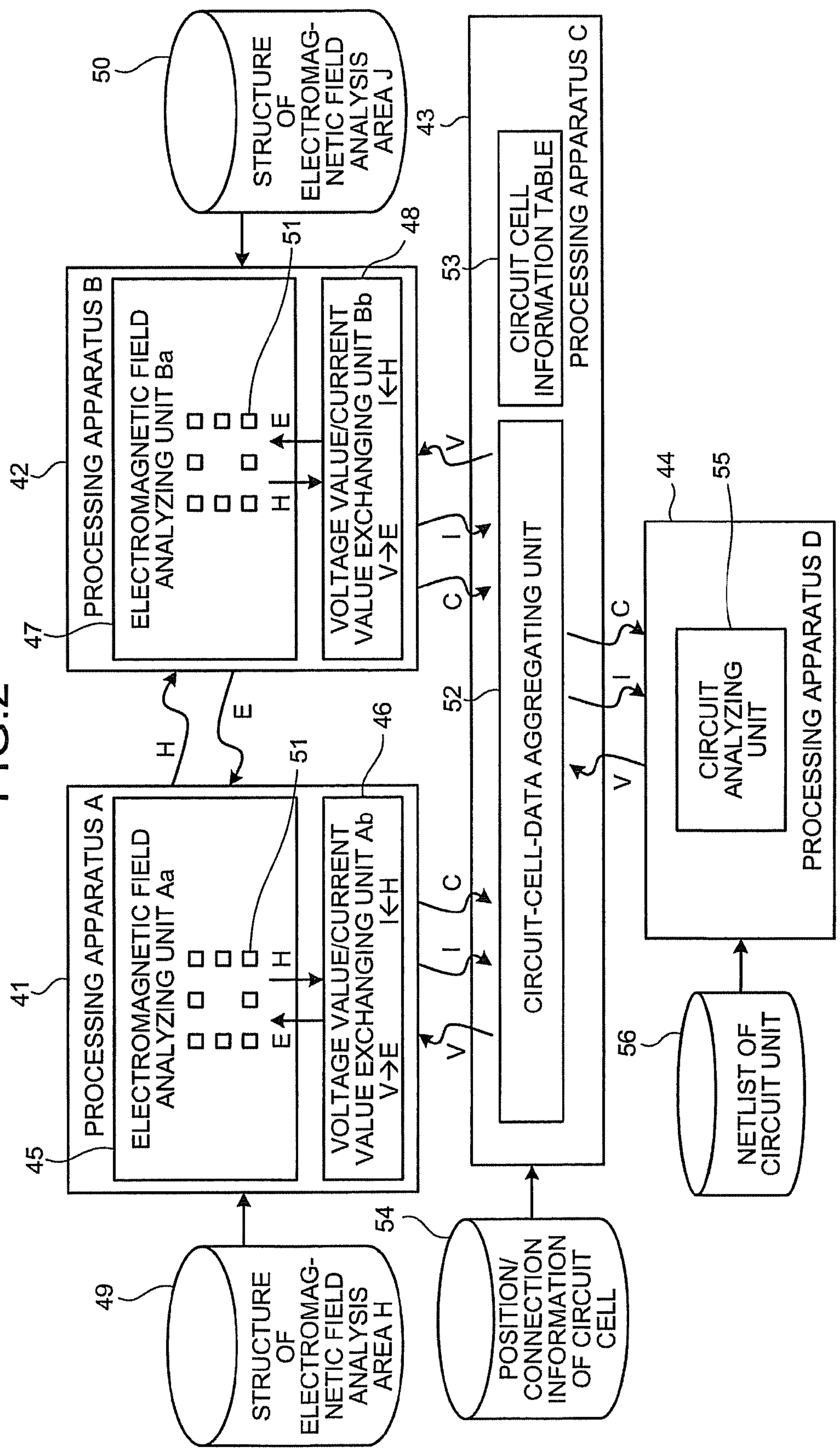
FIG.2
41
PROCESSING APPARATUS A
45
ELECTROMAGNETIC FIELD ANALYZING UNIT Aa
51
E
H
46
VOLTAGE VALUE/CURRENT VALUE EXCHANGING UNIT Ab
V→E
I←H
42
PROCESSING APPARATUS B
47
ELECTROMAGNETIC FIELD ANALYZING UNIT Ba
48
VOLTAGE VALUE/CURRENT VALUE EXCHANGING UNIT Bb
49
STRUCTURE OF ELECTROMAG-NETIC FIELD ANALYSIS AREA H
50
STRUCTURE OF ELECTROMAG-NETIC FIELD ANALYSIS AREA J
43
PROCESSING APPARATUS C
52
CIRCUIT-CELL-DATA AGGREGATING UNIT
53
CIRCUIT CELL INFORMATION TABLE
54
POSITION/ CONNECTION INFORMATION OF CIRCUIT CELL
44
PROCESSING APPARATUS D
55
CIRCUIT ANALYZING UNIT
56
NETLIST OF CIRCUIT UNIT
V
I
C CPU
101
ROM
102
RAM
103
HDD
104
HD
105
FDD
106
FD
107
DISPLAY
108
100
I/F
109
KEYBOARD
110
MOUSE
111
SCANNER
112
PRINTER
113
NETWORK
114

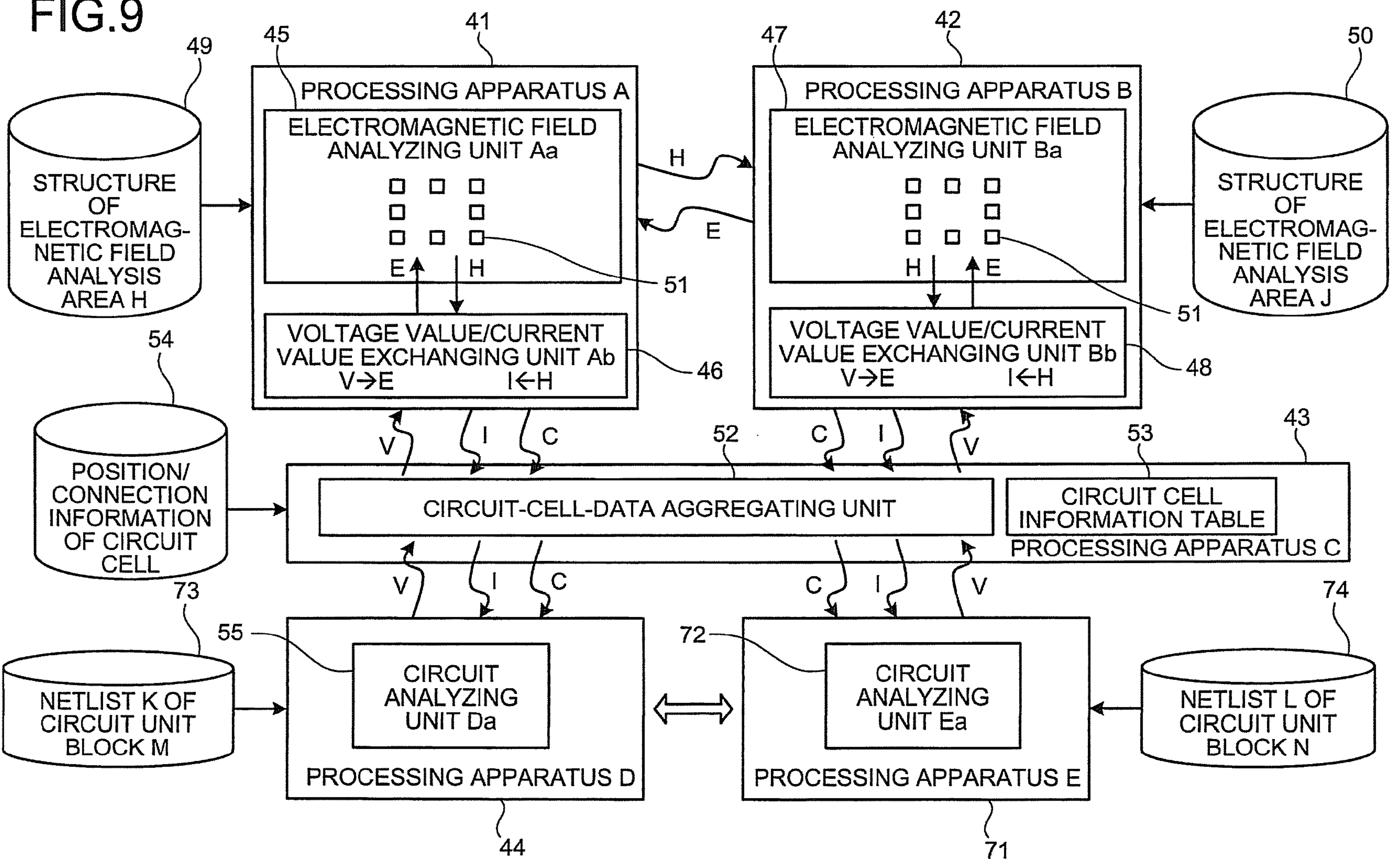

FIG.9
49
STRUCTURE OF ELECTROMAG-NETIC FIELD ANALYSIS AREA H
41
45
PROCESSING APPARATUS A
ELECTROMAGNETIC FIELD ANALYZING UNIT Aa
E
H
51
VOLTAGE VALUE/CURRENT VALUE EXCHANGING UNIT Ab
V→E
I←H
46
H
E
42
47
PROCESSING APPARATUS B
ELECTROMAGNETIC FIELD ANALYZING UNIT Ba
H
E
51
VOLTAGE VALUE/CURRENT VALUE EXCHANGING UNIT Bb
V→E
I←H
48
50
STRUCTURE OF ELECTROMAG-NETIC FIELD ANALYSIS AREA J
54
POSITION/ CONNECTION INFORMATION OF CIRCUIT CELL
V
I
C
52
43
53
CIRCUIT-CELL-DATA AGGREGATING UNIT
CIRCUIT CELL INFORMATION TABLE
PROCESSING APPARATUS C
73
NETLIST K OF CIRCUIT UNIT BLOCK M
55
CIRCUIT ANALYZING UNIT Da
PROCESSING APPARATUS D
44
72
CIRCUIT ANALYZING UNIT Ea
PROCESSING APPARATUS E
71
74
NETLIST L OF CIRCUIT UNIT BLOCK N

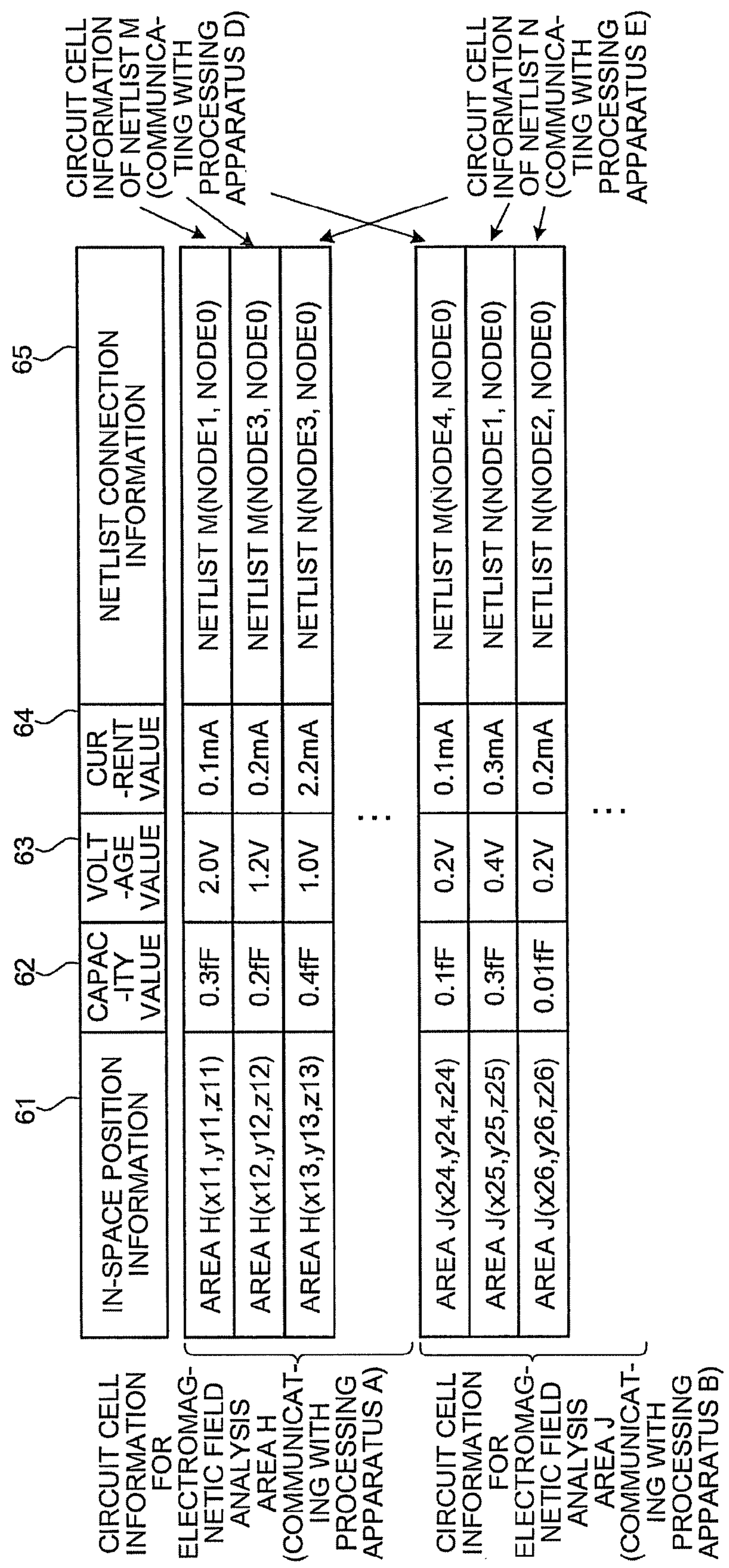
| IN-SPACE POSITION INFORMATION | CAPACITY VALUE | VOLTAGE VALUE | CURRENT VALUE | NETLIST CONNECTION INFORMATION |
|---|---|---|---|---|
| AREA H(x11,y11,z11) | 0.3fF | 2.0V | 0.1mA | NETLIST M(NODE1, NODE0) |
| AREA H(x12,y12,z12) | 0.2fF | 1.2V | 0.2mA | NETLIST M(NODE3, NODE0) |
| AREA H(x13,y13,z13) | 0.4fF | 1.0V | 2.2mA | NETLIST N(NODE3, NODE0) |
| ... | | | | |
| AREA J(x24,y24,z24) | 0.1fF | 0.2V | 0.1mA | NETLIST M(NODE4, NODE0) |
| AREA J(x25,y25,z25) | 0.3fF | 0.4V | 0.3mA | NETLIST N(NODE1, NODE0) |
| AREA J(x26,y26,z26) | 0.01fF | 0.2V | 0.2mA | NETLIST N(NODE2, NODE0) |
| ... | | | | |

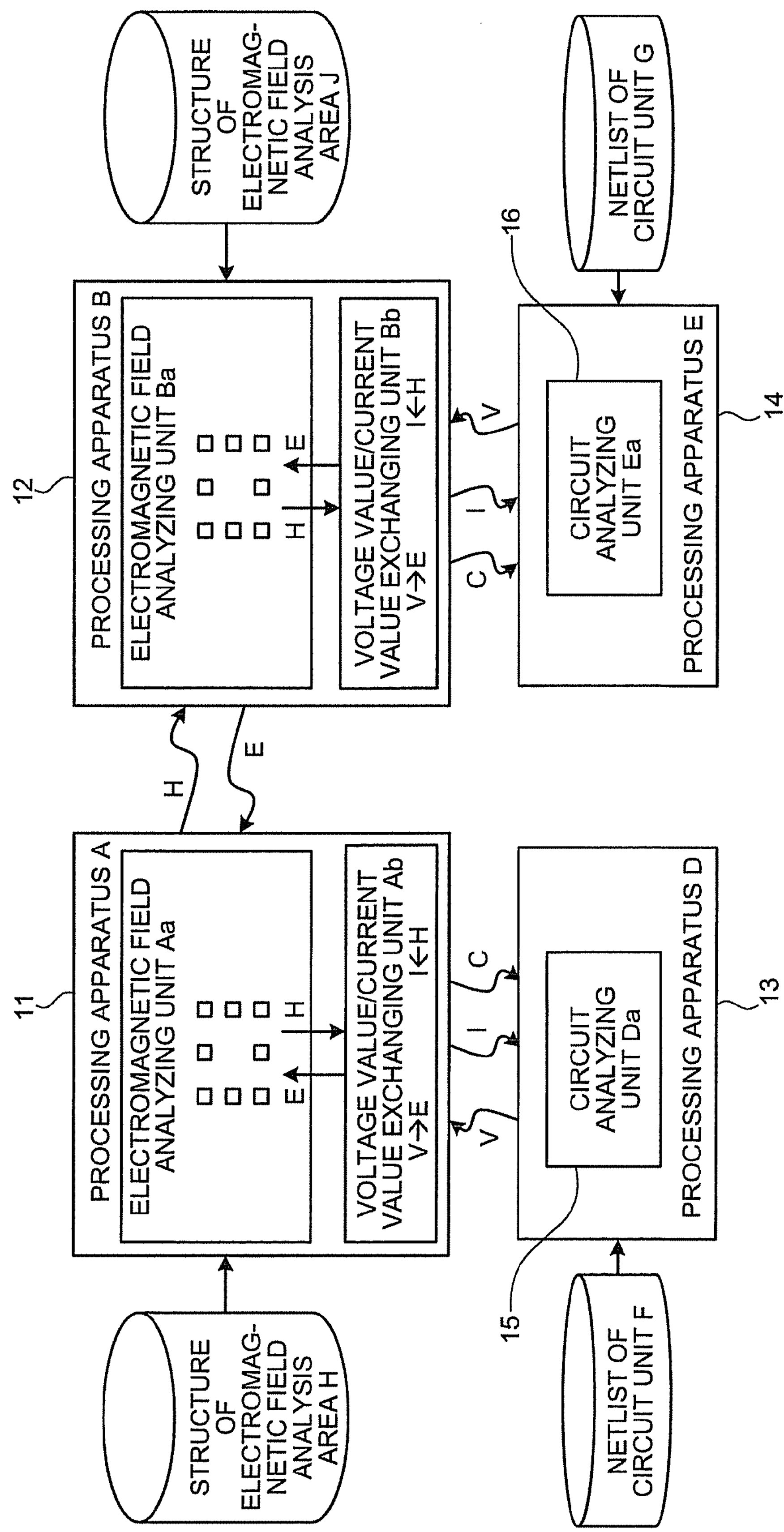
FIG.12
STRUCTURE OF ELECTROMAGNETIC FIELD ANALYSIS AREA J
STRUCTURE OF ELECTROMAGNETIC FIELD ANALYSIS AREA H
PROCESSING APPARATUS B
ELECTROMAGNETIC FIELD ANALYZING UNIT Ba
VOLTAGE VALUE/CURRENT VALUE EXCHANGING UNIT Bb
V→E
I←H
PROCESSING APPARATUS A
ELECTROMAGNETIC FIELD ANALYZING UNIT Aa
VOLTAGE VALUE/CURRENT VALUE EXCHANGING UNIT Ab
PROCESSING APPARATUS E
CIRCUIT ANALYZING UNIT Ea
PROCESSING APPARATUS D
CIRCUIT ANALYZING UNIT Da
NETLIST OF CIRCUIT UNIT G
NETLIST OF CIRCUIT UNIT F
H
E
V
I
C
11
12
13
14
15
16

SIMULATION SYSTEM USING ELECTROMAGNETIC FIELD ANALYSIS AND CIRCUIT ANALYSIS AND RECORDING MEDIUM STORING SIMULATION PROGRAM

This application is a continuation of International Application No. PCT/JP2006/326251, filed Dec. 28, 2006, the disclosure of which is herein incorporated in its entirety by reference.

FIELD

The embodiments discussed herein are related to a simulation system that executes a simulation that is an integration of electromagnetic field analysis and circuit analysis in parallel.

BACKGROUND

A finite difference time domain (FDTD) method is one method of analyzing transitional behavior of an electromagnetic field by a numerical simulation using a computer. Further, there is a method of analyzing transitional behavior of a circuit by a numerical simulation through the execution of a circuit analysis program, such as simulation program with integrated circuit emphasis (SPICE), by a computer.

There are numerical simulation methods that integrate electromagnetic field analysis and circuit analysis (hereinafter, "integrated simulation method"). An integrated simulation method can collectively analyze the characteristics of circuit elements and surrounding electromagnetic field phenomena and therefore, is very useful for analyzing high-frequency signals propagated in the circuit.

Herein, the applicant presents a proposal concerning a simulating apparatus that executes an integrated simulation method such as that disclosed in Japanese Laid-Open Patent Publication No. H11-153634. In the proposal, the link between electromagnetic field analysis and circuit analysis is facilitated by respectively correlating an electric field and a magnetic field of a cell that is allocated with external terminals of a circuit for the FDTD method (hereinafter, "circuit cell") with a voltage and a current of an equivalent circuit connected to the circuit terminals. According to the proposal, a stable solution can be obtained with a small amount of calculation.

However, when a conventional integrated simulation method is executed using one computer having a single central processing unit (CPU), the area to be analyzed is restricted by calculation resources such as the capacities of the hard disk and memory. The time necessary for the calculation is substantially determined by operating speeds of the CPU and the memory.

Therefore, to analyze a larger area at a high speed, parallel processing by multiple CPUs is desirable. Thus, with respect a large area for which analysis is difficult by one computer, a system that efficiently executes analysis in a short time by parallel processing using multiple computers and without a decrease in the precision of the analysis by a conventional integrated simulation method has been proposed (see, for example, Japanese Laid-Open Patent Publication No. 2004-54642).

A computer or a CPU of such a system is referred to as "processing apparatus" hereinafter. To avoid confusion in the description hereinafter, physically different components having the same name will be distinguished from each other by a single letter or consecutive letters (such as "A" or "Aa") appended to the name.

FIG. 11 is a diagram of a configuration of an area that is to be analyzed and is divided according to a conventional integrated simulation method employing parallel processing. As depicted in FIG. 11, a printed circuit board 1 is divided, by a dividing border 2, into electromagnetic field analysis areas H3 and J4. Circuit units F5 and G6 are respectively disposed in closed spaces of the electromagnetic field analysis areas H3 and J4. The circuit units F5 and G6 each include circuit elements such as an LSI.

FIG. 12 is a diagram of a configuration of a conventional simulation system that executes an integrated simulation method employing parallel processing. In the analysis of an area having a configuration as depicted in FIG. 11, as depicted in FIG. 12, processing apparatuses A11, B12, D13 and E14 respectively are responsible for electromagnetic field analysis executed with respect to the electromagnetic field analysis areas H3 and J4, and for circuit analysis executed with respect to circuit units F5 and G6.

Magnetic field data (H) and electric field data (E) are transmitted and received between the processing apparatus A11 and B12. Capacity data (C), current data (I), and voltage data (V) are transmitted and received between the processing apparatuses A11 and D13 and also between the processing apparatuses B12 and E14. On the other hand, no data is transmitted or received between the processing apparatuses D13 and E14. This is because, as depicted in FIG. 11, the circuit units F5 and G6 are respectively disposed in closed spaces of the electromagnetic field analysis areas H3 and J4.

FIG. 13 is a diagram of a configuration of an equivalent circuit of a circuit unit employing a current source method. As depicted in FIG. 13, an equivalent circuit 21 is represented by a current source 23 connected between both terminals of a circuit model unit 22, and a capacitor 24 connected in parallel to the current source 23. Based on the equivalent circuit 21, circuit analyzing units Da15 and Ea16 respectively of the processing apparatuses D13 and E14 each execute, for example, circuit analysis by the SPICE and obtain a voltage V applied between both terminals of the circuit model unit 22.

However, in the above conventional integrated simulation method employing parallel processing, if the circuit unit spans multiple electromagnetic field analysis areas due to the division of the space, when circuit analysis of the circuit unit is executed for a portion included in one electromagnetic field analysis area, data on the current and the voltage of another portion included in another electromagnetic field analysis area is insufficient. Therefore, no circuit analysis can be executed.

Thus, as a preventative measure, as depicted in FIG. 11, the printed circuit board is divided such that each circuit unit is disposed in a closed electromagnetic field analysis area. However, on an actual printed circuit board, many circuit parts are disposed complicatedly entangled with each other. Therefore, to divide a printed circuit board in such a manner is quite difficult. That is, when many LSIs are mounted on a printed circuit board as is recently the case, a problem arises in that simulation cannot be executed.

SUMMARY

According to an aspect of an embodiment, an area to be analyzed is divided into plural electromagnetic field analysis areas and electromagnetic field analysis is executed with respect to the electromagnetic field analysis areas by parallel processing using plural processing apparatuses having a function as an electromagnetic field analyzing unit. Circuit analysis, with respect to a circuit unit included in the area to be analyzed, is executed by a processing apparatus having a function as a circuit analyzing unit.

Furthermore, a processing apparatus is provided that has a function as an aggregating unit executing the transmission and reception of data among the processing apparatuses that execute the electromagnetic field analysis and the processing apparatus that executes the circuit analysis. The processing apparatus, from the processing apparatuses executing the electromagnetic field analyses, aggregates data for the circuit analysis and transmits the aggregated data to the processing apparatus that executes the circuit analysis. Further, the processing apparatus having a function as the aggregating unit, from the processing apparatus executing the circuit analysis, aggregates data for the electromagnetic field analysis and transmits the aggregated data to the processing apparatuses that execute the electromagnetic field analysis.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a diagram of a configuration of a simulation system according to the first embodiment of the present invention;

FIG. 9 is a diagram of a configuration of a simulation system according to the second embodiment;

FIG. 10 is a diagram of a configuration of a circuit cell information table of the simulation system according to the second embodiment;

FIG. 12 is a diagram of a configuration of a conventional simulation system.

DESCRIPTION OF EMBODIMENTS

Preferred embodiments of the present invention will be explained with reference to the accompanying drawings. However, the present invention is not limited to the embodiments.

Figure 1:
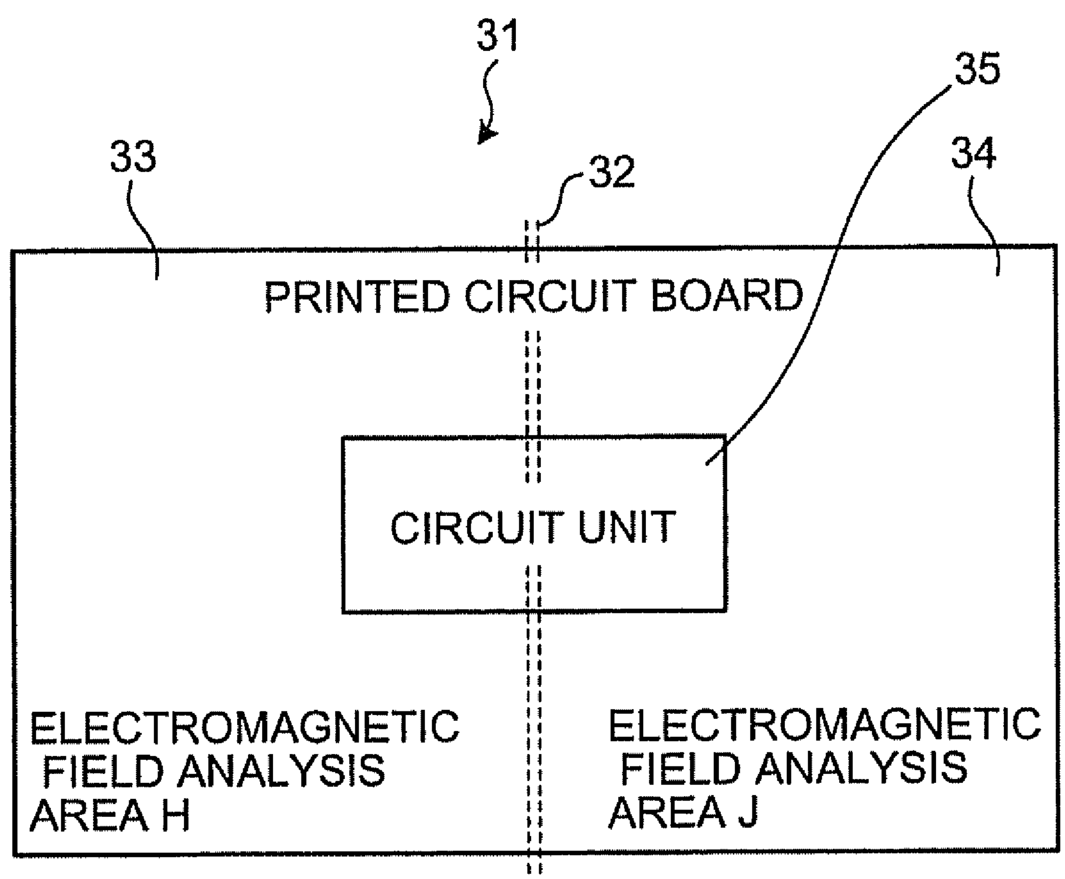
FIG. 1 is a diagram of a configuration of an area to be analyzed that has been divided for an integrated simulation method, according to a first embodiment.

FIG. 1 is a diagram of a configuration of an area to be analyzed that has been divided for an integrated simulation method, according to a first embodiment. As depicted in FIG. 1, in the first embodiment, a printed circuit board 31 is divided into electromagnetic field analysis areas H33 and J34 by a dividing border 32. A circuit unit 35 is disposed spanning the electromagnetic field analysis areas H33 and J34.

The printed circuit board 31 is an area to be analyzed. The electromagnetic field analysis areas H33 and J34 are areas subject to electromagnetic field analysis by an FDTD method, etc. The circuit unit 35 is an area subject to circuit analysis by a SPICE, etc. The circuit unit 35 includes circuit elements such as an LSI.

FIG. 2 is a diagram of a configuration of a simulation system according to the first embodiment of the present invention. In the analysis of an area having a configuration as depicted in FIG. 1, as depicted in FIG. 2, processing apparatuses A41, B42, C43 and D44 are responsible for electromagnetic field analysis with respect to the electromagnetic field analysis areas H33 and J34, the aggregation of data of circuit cells, and the circuit analysis with respect to the circuit unit 35.

The processing apparatuses A41, B42, and C43 are connected through a network and mutually communicate data. The processing apparatus C43 and the processing apparatus D44 are connected and mutually communicate data.

The processing apparatus A41 includes an electromagnetic field analyzing unit Aa45 and a voltage value/current value exchanging unit Ab46. The processing apparatus B42 includes an electromagnetic field analyzing unit Ba47 and a voltage value/current value exchanging unit Bb48. The electromagnetic field analyzing units Aa45 and Ba47 respectively calculate the transitional variations of an electric field E at a side of a circuit cell 51 and a magnetic field H around the side, based on structure data 49 and 50 for electromagnetic field analysis areas H and J, respectively.

The voltage value/current value exchanging units Ab46 and Bb48 each convert a magnetic field (H) around the circuit cell into a current (I) and transmit the current value to the processing apparatus C43. The voltage value/current value exchanging units Ab46 and Bb48 each convert the voltage (V) transmitted from the processing apparatus C43 into an electric field (E) and sets the electric field in the circuit cell.

The processing apparatus C43 includes a circuit-cell-data aggregating unit 52. The circuit-cell-data aggregating unit 52 receives the capacity (C) and the current (I) of an equivalent circuit from the processing apparatuses A41 and B42, receives the voltage (V) of the equivalent circuit from the processing apparatus D44, and creates a circuit cell information table 53 of the received values.

The circuit-cell-data aggregating unit 52 selects data for the circuit analysis from the circuit cell information table 53 based on position and connection information data 54 of the circuit cell, and transmits the data to the processing apparatus D44. The circuit-cell-data aggregating unit 52, based on the position and connection information data 54 of the circuit cell, also selects data for the electromagnetic field analysis by the electromagnetic field analyzing unit Aa45 from the circuit cell information table 53 and transmits the data to the processing apparatus A41. The circuit-cell-data aggregating unit 52 further selects data for the electromagnetic field analysis by the electromagnetic field analyzing unit Ba47 and transmits the data to the processing apparatus B42.

The processing apparatus D44 includes a circuit analyzing unit 55. The circuit analyzing unit 55 solves, based on a netlist 56 of the circuit unit, a netlist circuit equation. A method of calculating an electromagnetic field in the FDTD method, a method of calculating a current of an equivalent circuit, a method of calculating an electric field of a circuit cell from a voltage of an equivalent circuit, etc., are described in detail in the Patent Documents 1 and 2 and therefore, description for such methods is omitted.

Figure 3:
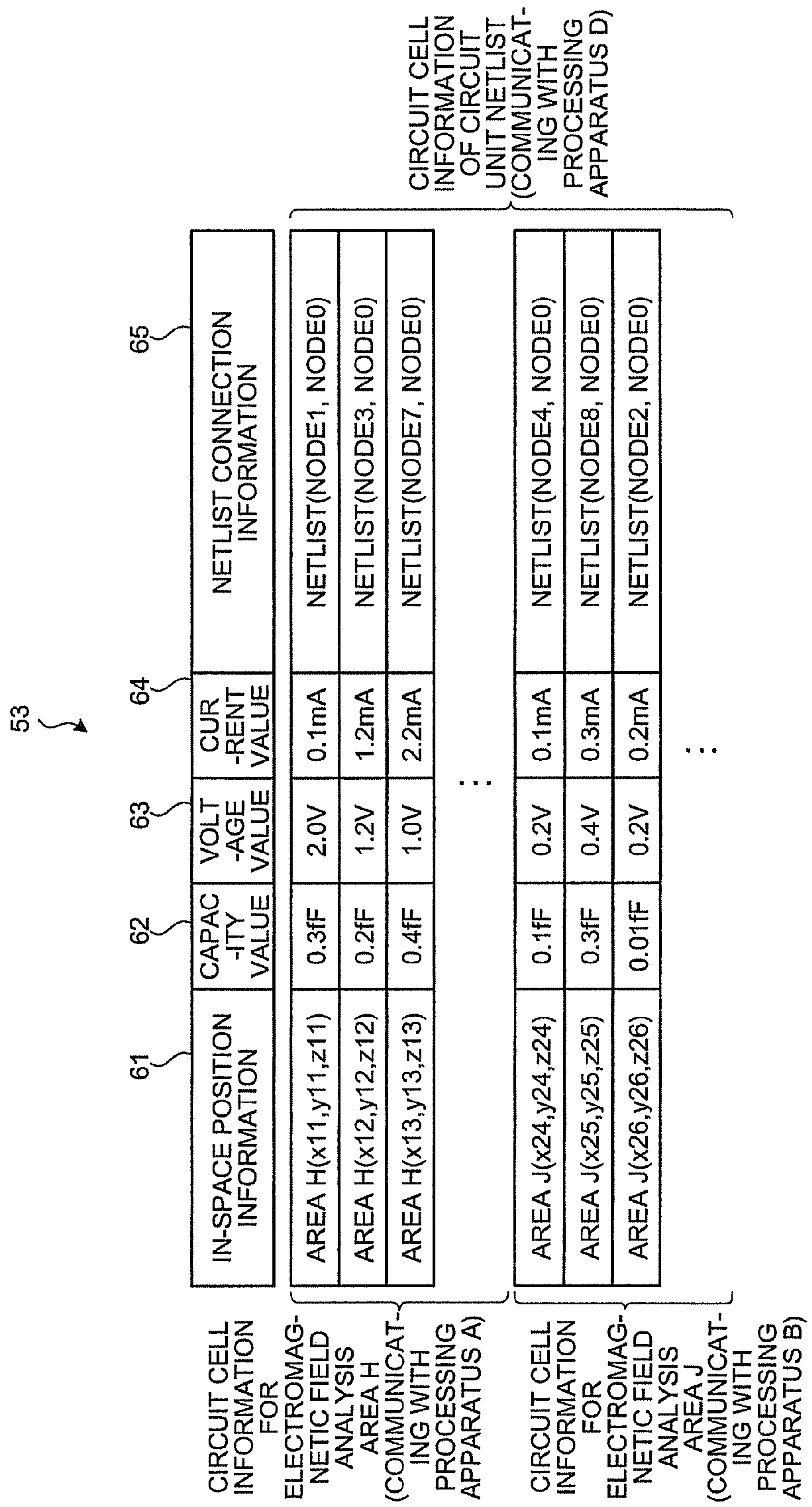
FIG. 3 is a diagram of a configuration of a circuit cell information table of the simulation system according to the first embodiment.

FIG. 3 is a diagram of a configuration of a circuit cell information table of the simulation system according to the first embodiment of the present invention. As depicted in FIG. 3, the circuit cell information table 53 includes an in-space position information field 61, a capacity value field 62, a voltage value field 63, a current value field 64, and a netlist connection information field 65.

The in-space position information field 61 stores therein information indicating coordinates in the space of the circuit cell. The capacity value field 62 and the current value field 64 respectively store therein the capacity value and the current value of the equivalent circuit transmitted from the processing apparatus A41 or B42. The voltage value field 63 stores therein the voltage value of the equivalent circuit transmitted from the processing apparatus D44. The netlist connection information field 65 stores therein information concerning a netlist in connection to the equivalent circuit.

The circuit-cell-data aggregating unit 52 refers to the in-space position information field 61 of each record of the circuit cell information table 53. The circuit-cell-data aggregating unit 52 transmits to the processing apparatus A41, the value stored in the voltage value field 63 for the record that, in the in-space position information field 61, stores coordinates that are coordinates in the electromagnetic field analysis area H33. On the other hand, when the coordinates stored in the in-space position information field 61 of the record are coordinates in the electromagnetic field analysis area J34, the circuit-cell-data aggregating unit 52 transmits the value stored in the voltage value field 63 to the processing apparatus B42.

Based on the information concerning the connection destination netlist stored in the netlist connection information field 65, the circuit-cell-data aggregating unit 52 transmits the stored values of the capacity value field 62 and the current value field 64 of the record to the processing apparatus D44, which is responsible for the analysis of the netlist. For all the records in the circuit cell information table 53, the destination of the transmission of the stored values of the capacity value field 62 and the current value field 64 is the processing apparatus D44.

Figure 4:
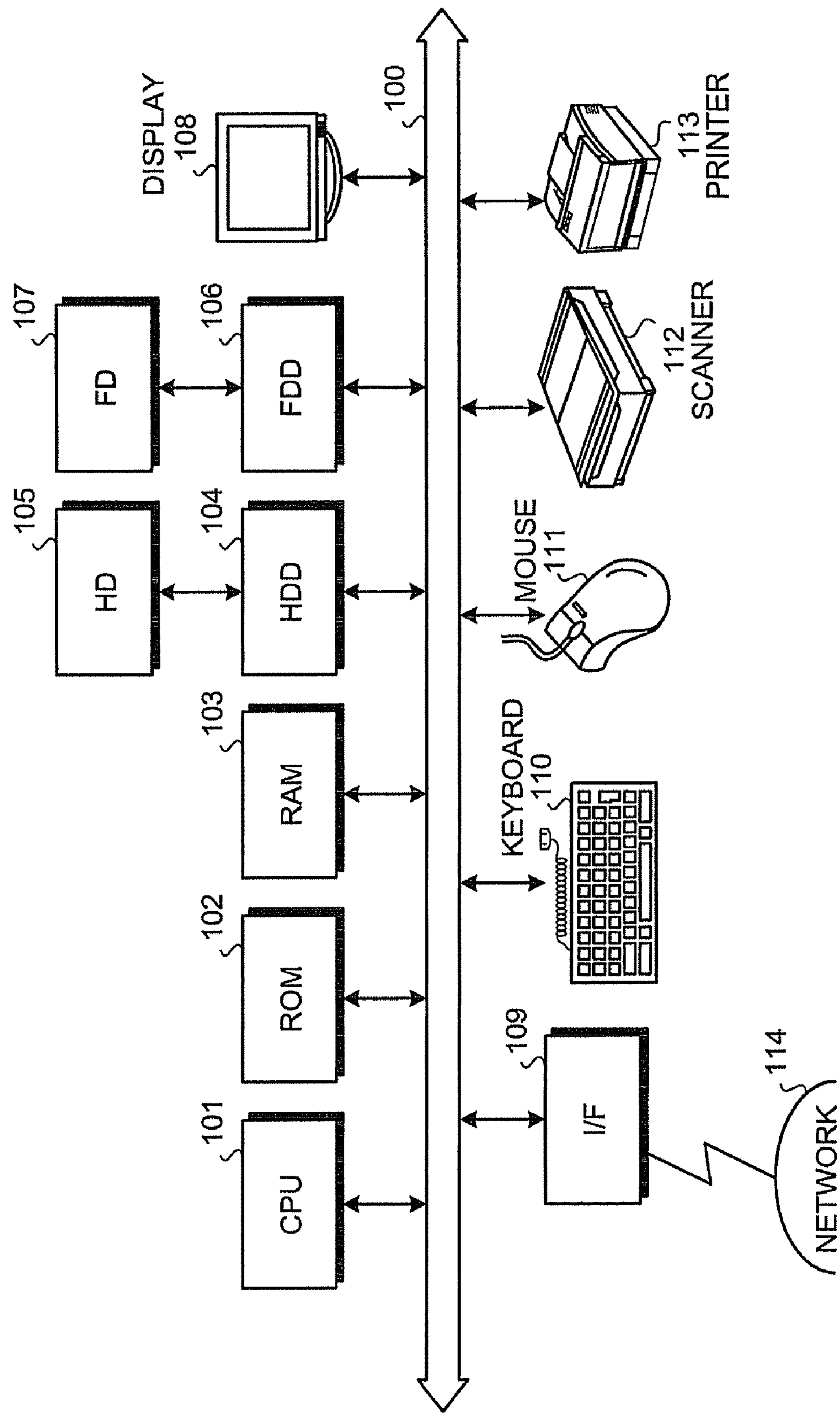
FIG. 4 is a block diagram of each processing apparatus.

FIG. 4 is a block diagram of each processing apparatus. As depicted in FIG. 4, each processing apparatus A41, B42, C43, and D44 includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a removal recording medium, a display 108, an interface (I/F) 109, a keyboard 110, a mouse 111, a scanner 112, and a printer 113, respectively connected by way of a bus 100.

The CPU 101 governs overall control of the processing apparatus. The ROM 102 stores therein programs such as a boot program. The RAM 103 is used as a work area of the CPU 101. The HDD 104, under the control of the CPU 101, controls the reading and the writing of data with respect to the HD 105. The HD 105 stores therein the data written under control of the HDD 104.

The FDD 106, under the control of the CPU 101, controls the reading and the writing of data with respect to the FD 107. The FD 107 stores therein the data written under control of the FDD 106, the data being read by the processing apparatus.

In addition to the FD 107, a removable recording medium may be a compact disk read-only memory (CD-ROM), compact disk-recordable (CD-R), a compact disk-rewritable (CD-RW), a magneto optical disk (MO), a Digital Versatile Disc (DVD), a memory card, etc. The display 108 displays a cursor, an icon, a tool box, and data such as document, image, and function information. The display 108 may be, for example, a cathode ray tube (CRT), a thin-film-transistor (TFT) liquid crystal display, or a plasma display.

The I/F 109 is connected to a network 114 such as the Internet through a telecommunications line and is connected to other devices by way of the network 114. The I/F 109 administers the network 114 and an internal interface, and controls the input and the output of data with respect to external devices. The I/F 109 may be, for example, a modem or a local area network (LAN) adapter.

The keyboard 110 is equipped with keys for the input of characters, numerals, and various instructions, and data is entered through the keyboard 110. The keyboard 110 may be a touch-panel input pad or a numeric keypad. The mouse 111 performs cursor movement, range selection, and movement, size change, etc., of a window. The mouse 111 may be a trackball or a joystick provided the trackball or joystick has similar functions as a pointing device.

The scanner 112 optically reads an image and takes in the image data into the processing apparatus. Further, the scanner 112 may have an optical character recognition (OCR) function. The printer 113 prints image data and document data. The printer 113 may be, for example, a laser printer or an ink jet printer.

More specifically, respective functions of the electromagnetic field analyzing unit Aa45, the voltage value/current value exchanging unit Ab46, the electromagnetic field analysis unit Ba47, the voltage value/current value exchanging unit Bb48, the circuit-cell-data aggregating unit 52, and the circuit analyzing unit 55 are realized by, for example, execution by the CPU 101 of a program recorded on a recording medium such as the ROM 102, the RAM 103, and the HDD 105 depicted in FIG. 4, or by the I/F 109. The circuit cell information table 53 is created on a recording medium such as the RAM 103 and the HDD 105 depicted in FIG. 4.

Figure 5:
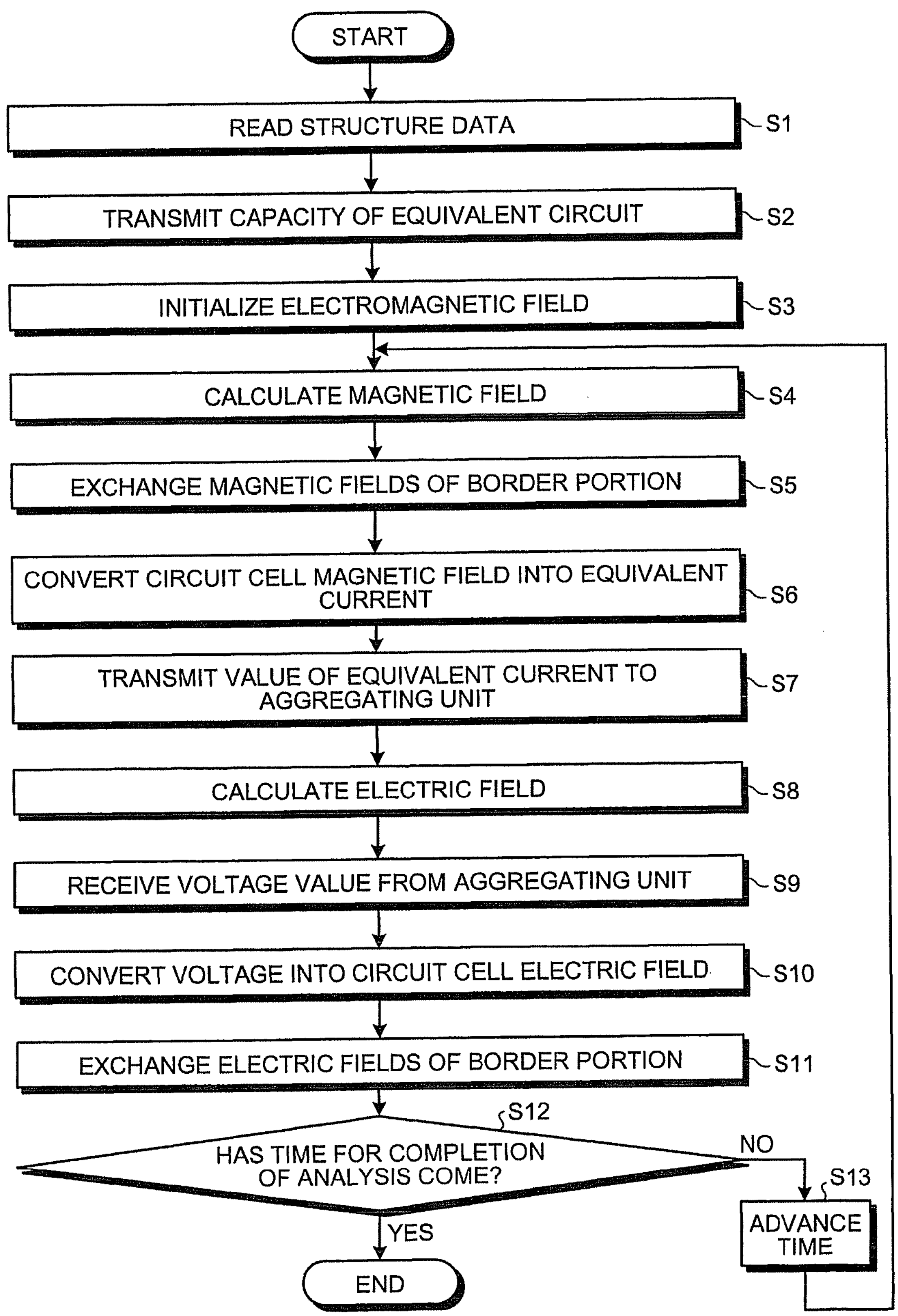
FIG. 5 is a diagram for explaining operations of the processing apparatuses that are responsible for electromagnetic field analysis of the simulation system according to the first embodiment.

FIG. 5 is a diagram for explaining operations of the processing apparatuses that are responsible for the electromagnetic field analysis of the simulation system according to the first embodiment of the present invention. As depicted in FIG. 5, when electromagnetic field analyzing processes of the processing apparatuses A41 and B42 are started, the processing apparatus A41 reads the structure data 49 of the electromagnetic field analysis area H. The processing apparatus B42 simultaneously reads the structure data 50 of the electromagnetic field analysis area J (step S1).

The processing apparatus A41 calculates the capacity of the equivalent circuit of the circuit cell 51 included in the electromagnetic field analysis area H33 and transmits the calculated value (the equivalent circuit capacity) to the circuit-cell-data aggregating unit 52 of the processing apparatus C43. Similarly, the processing apparatus B42 calculates the capacity of the equivalent circuit of the circuit cell 51 included in the electromagnetic field analysis area J34 and transmits the calculated value (the equivalent circuit capacity) to the circuit-cell-data aggregating unit 52 (step S2). The processing apparatuses A41 and B42 initialize the electromagnetic fields (step S3).

The electromagnetic field analysis units Aa45 and Ba47 each calculate a magnetic field (step S4) and exchange the magnetic field of the border portion (step S5). Until this processing, the position of the magnetic field in the entire space is determined. Therefore, the voltage value/current value exchanging unit Ab46 converts the magnetic field around the circuit cell 51 included in the electromagnetic field analysis area H33 into the equivalent current of the circuit cell. Similarly, the voltage value/current value exchanging unit Bb48 converts the magnetic field around the circuit cell 51 included in the electromagnetic field analysis area J34 into the equivalent current of the circuit cell (step S6).

The processing apparatuses A41 and B42 transmit the equivalent current values obtained by the voltage value/current value exchanging units Ab46 and Bb48 to the circuit-cell-data aggregating unit 52 of the processing apparatus C43 (step S7). The electromagnetic field analyzing units Aa45 and Ba47 each calculate and analyze the electric field (step S8).

When the electric field analysis comes to an end, the processing apparatuses A41 and B42 request the circuit cell voltage value from the circuit-cell-data aggregating unit 52. The processing apparatuses A41 and B42 each receive a corresponding voltage value from the circuit-cell-data aggregating unit 52 as a response to the request for the voltage value (step S9). The voltage value/current value exchanging units Ab46 and Bb48 each convert the received voltage value into the electric field of the circuit cell, and each set the converted electric field in the circuit cell (step S10).

The electromagnetic field analyzing unit Aa45 sets the electric field of all the circuit cells in the electromagnetic field analysis area that electromagnetic field analyzing unit Aa45 is responsible for, and subsequently, exchanges the electric field of the border portion; similarly, the electromagnetic field analyzing unit Ba47 performs the same operations (step S11). Until this processing, the electric field in the entire space at a given time is determined. The processing apparatuses A41 and B42 respectively determine whether the completion time for the electromagnetic field analysis has come (step S12).

Consequently, if the completion time has come (step S12: YES), the processing apparatuses A41 and B42 each end a series of the electromagnetic field analysis processing. On the other hand, if the completion time has not come (step S12: NO), the time is advanced (step S13) and the processing at step S4 and the processing thereafter are repeated until the completion time.

Figure 6:
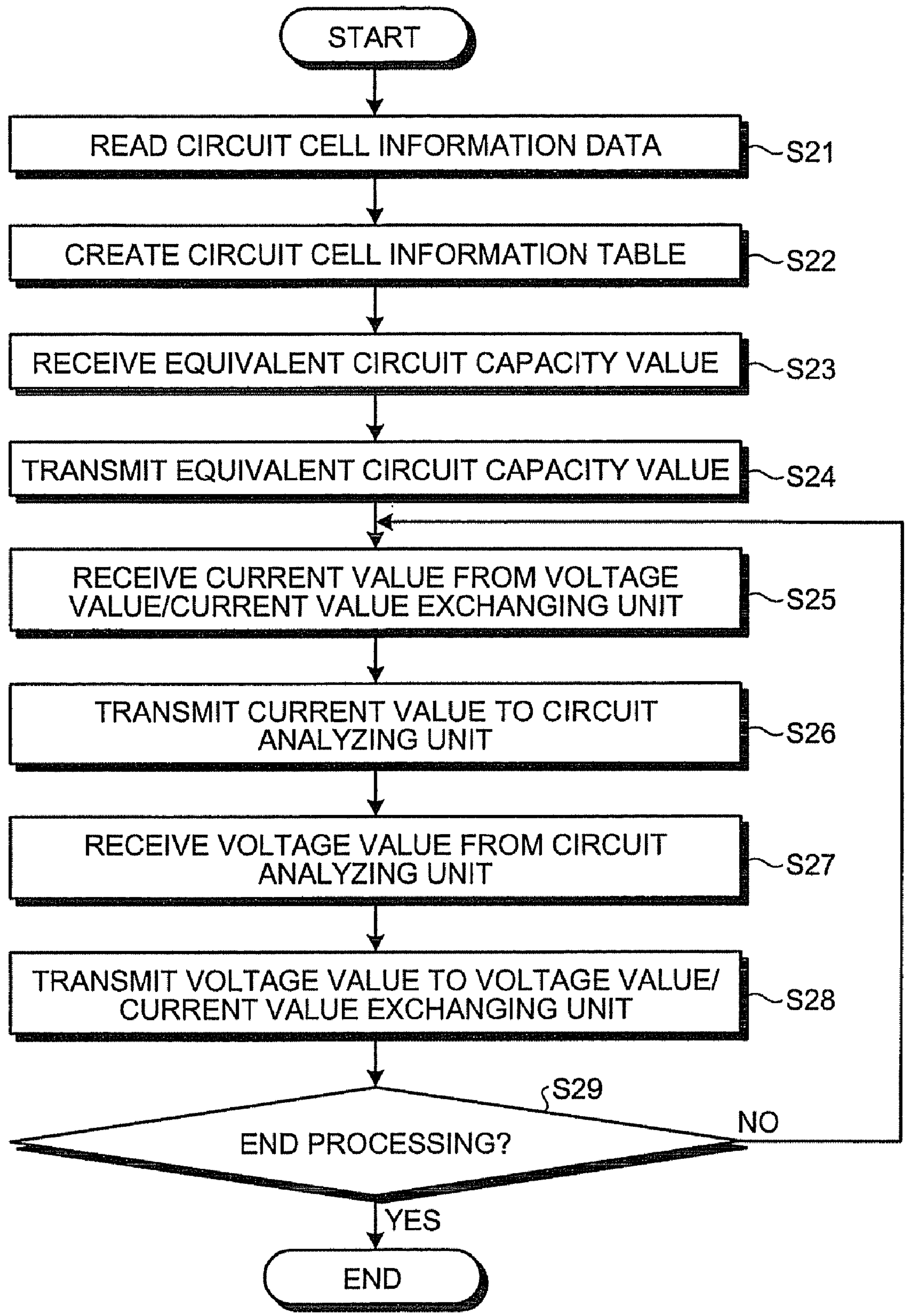
FIG. 6 is a diagram for explaining operations of the processing apparatus that is responsible for the data aggregation of the simulation system according to the first embodiment.

FIG. 6 is a diagram for explaining operations of the processing apparatus that is responsible for the data aggregation of the simulation system according to the first embodiment of the present invention. As depicted in FIG. 6, when a data aggregation process by the processing apparatus C43 is started, the processing apparatus C43 reads the position/connection information data 54 of the circuit cell and obtains the in-space position data of the circuit cell and the connection information in the circuit network as the circuit cell information (step S21).

The circuit-cell-data aggregating unit 52 stores the in-space position data and the connection information concerning the circuit network of the circuit cell in the fields of the circuit cell information table 53 prepared in advance, and creates the circuit cell information table 53 (step S22). Thereafter, the circuit-cell-data aggregating unit 52 receives the capacity values of the equivalent circuit transmitted from the processing apparatuses A41 and B42 at step S2 above, and stores the capacity values in the circuit cell information table 53 (step S23).

The circuit-cell-data aggregating unit 52 transmits the capacity values of the equivalent circuit to the circuit analyzing unit 55 of the processing apparatus D44 (step S24). Thereafter, the circuit-cell-data aggregating unit 52 receives the equivalent current values transmitted from the voltage value/current value exchanging units Ab46 and Bb48 respectively of the processing apparatuses A41 and B42 at step S7 above, and stores the current values in the circuit cell information table 53 (step S25).

Subsequently, when the circuit-cell-data aggregating unit 52 receives a request for the current values from the circuit analyzing unit 55 of the processing apparatus D44, the circuit-cell-data aggregating unit 52 refers to the circuit cell information table 53 and transmits the corresponding current values to the circuit analyzing unit 55 (step S26). Thereafter, the circuit-cell-data aggregating unit 52 receives the voltage values of the equivalent circuit from the circuit analyzing unit 55 and stores the voltage values in the circuit cell information table 53 (step S27).

When the circuit-cell-data aggregating unit 52 receives requests for the voltage values from the processing apparatuses A41 and B42, the circuit-cell-data aggregating unit 52 refers to the circuit cell information table 53 and transmits the corresponding voltage values to the voltage value/current value exchanging units Ab46 or Bb48 respectively of the processing apparatuses A41 and B42 (step S28). The transmitted voltage values are received by the processing apparatus A41 or B42 at step S9 above.

Whether the data aggregating process comes to an end, that is, whether the electromagnetic field analysis by each of the processing apparatuses A41 and B42 and the circuit analysis by the processing apparatus D44 come to an end is determined (step S29). Consequently, if the analyses are to come to an end (step S29: YES), the processing apparatus C43 ends a series of the data aggregating processing depicted in FIG. 6. On the other hand, if the analyses are not to come to an end (step S29: NO), the processing at step S25 and the processing thereafter are repeated until the analyses are to come to an end.

Figure 7:
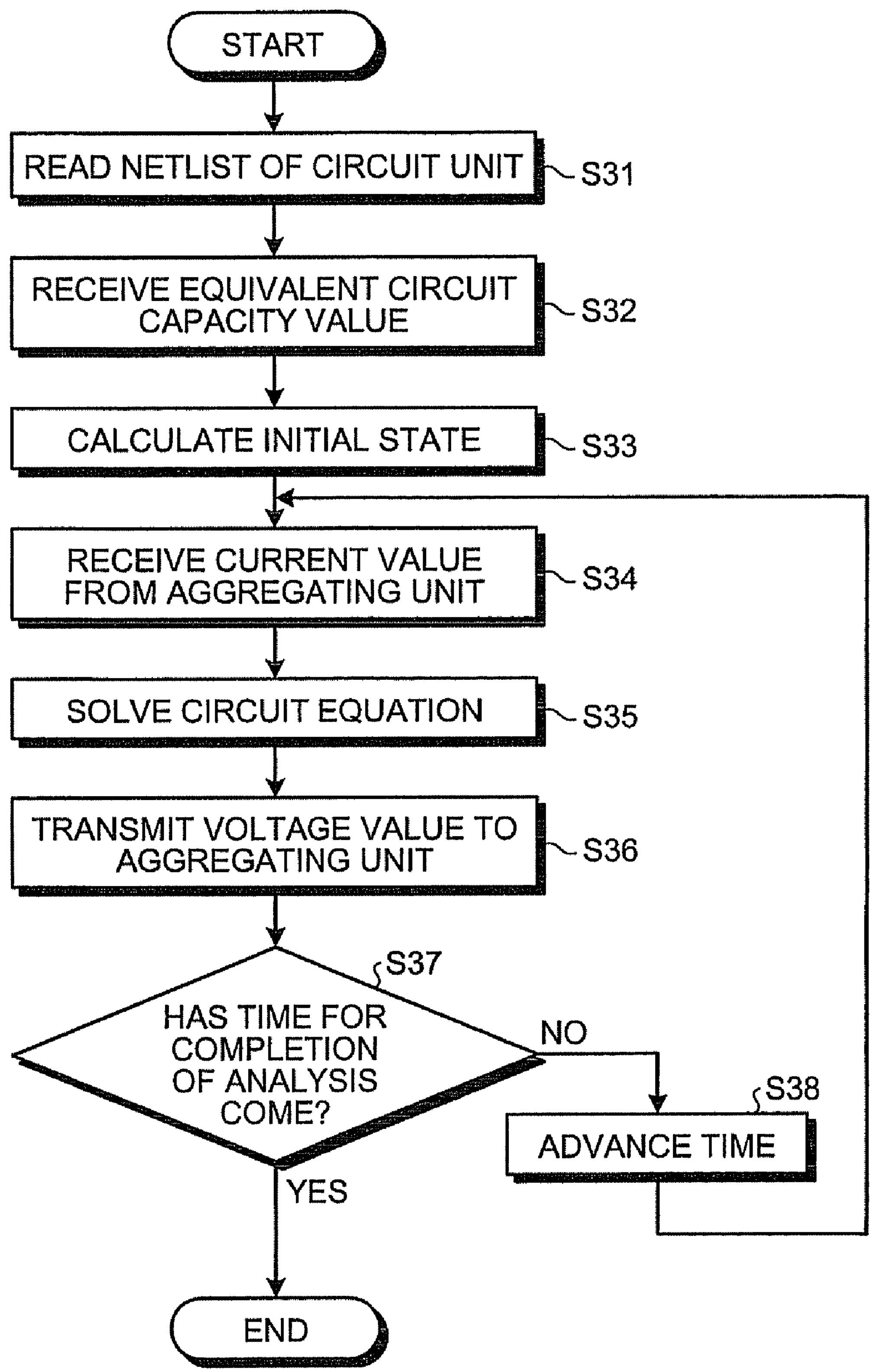
FIG. 7 is a diagram for explaining operations of the processing apparatus that is responsible for circuit analysis of the simulation system according to the first embodiment.

FIG. 7 is a diagram for explaining operations of the processing apparatus that is responsible for the circuit analysis of the simulation system according to the first embodiment of the present invention. As depicted in FIG. 7, when the circuit analyzing process of the processing apparatus D44 is started, the processing apparatus D44 reads the netlist 56 of the circuit unit (step S31). The circuit analyzing unit 55 receives the capacity values of the equivalent circuit transmitted from the circuit-cell-data aggregating unit 52 at step S24 above (step S32) and calculates the initial state of the circuit (step S33).

The circuit analyzing unit 55 requests the equivalent current value for the circuit cell from the circuit-cell-data aggregating unit 52. The circuit analyzing unit 55 receives the current value transmitted from the circuit-cell-data aggregating unit 52 at step S26 above in response to the request for the current value (step S34). The circuit analyzing unit 55 receives the current values of the equivalent circuits for all the circuit cells described in the netlist and, thereafter, solves the circuit equation of the netlist (step S35).

Thereby, the voltage of the equivalent circuit of the circuit cell is determined. Therefore, the processing apparatus D44 transmits the voltage value to the circuit-cell-data aggregating unit 52 (step S36). The transmitted voltage value is received by the processing apparatus C43 at step S27 above.

The processing apparatus D44 determines whether the completion time for the circuit analysis has come (step S37). Consequently, if the completion time has come (step S37: YES), the processing apparatus D44 ends a series of the circuit analysis processing depicted in FIG. 7. On the other hand, if the completion time has not come (step S37: NO), the time is advanced (step S38) and the processing at step S34 and the processing thereafter are repeated until the completion time.

According to the first embodiment, the data obtained by each of the electromagnetic field analyzing units Aa45 and Ba47 are aggregated to the circuit-cell-data aggregating unit 52 and the data are transmitted from the circuit-cell-data aggregating unit 52 to the circuit analyzing unit 55. Therefore, even when the circuit unit 35 spans the electromagnetic field analysis areas H33 and J34 due to the space division and the circuit terminals of the circuit unit 35 are allocated to circuit cells that are disposed being dispersed in the divided space areas, the circuit analyzing unit 55 can execute the circuit analysis without dividing the circuit unit 35.

According to the first embodiment, an integrated simulation method employing parallel processing can be efficiently executed. For example, for the configuration of the analysis area depicted in FIG. 1, a wide area including the circuit unit 35 (for example, about 3.5 cm×3.5 cm×2 mm) is taken as one area such that the circuit unit 35 is not divided by the dividing border 32. It is estimated that a memory of 4 GB is necessary and it takes 42 days for the calculation to come to an end when high-precision analysis to a time period of 10 ns is executed with respect to this area by a FDTD method using one processing apparatus. Whereas, as in the first embodiment, for example, it is estimated that, when the area that is used for the above estimation is divided into 64 areas and the 64 areas are processed in parallel using 64 processing apparatuses, the amount of memory for each processing apparatus may be 64 MB and the calculation takes 18 hours to come to an end.

Figure 8:
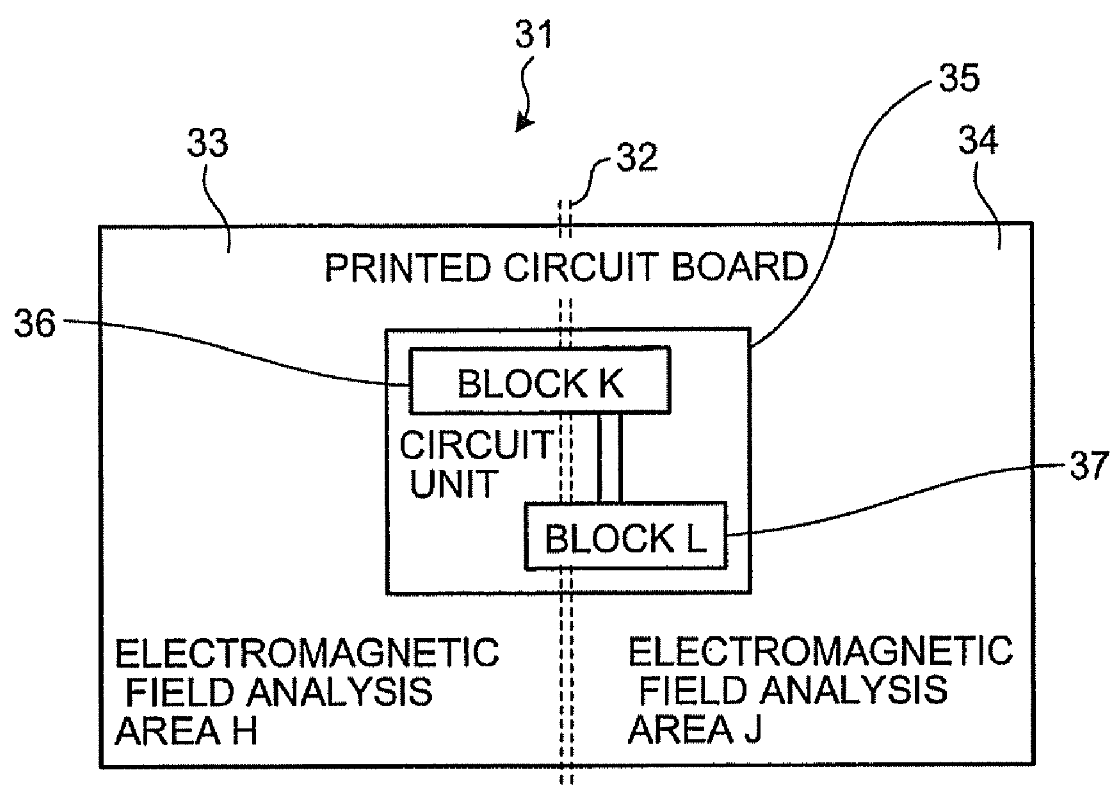
FIG. 8 is a diagram of a configuration of an area to be analyzed that has been divided for an integrated simulation method, according to a second embodiment of the present invention.
Figure 11:
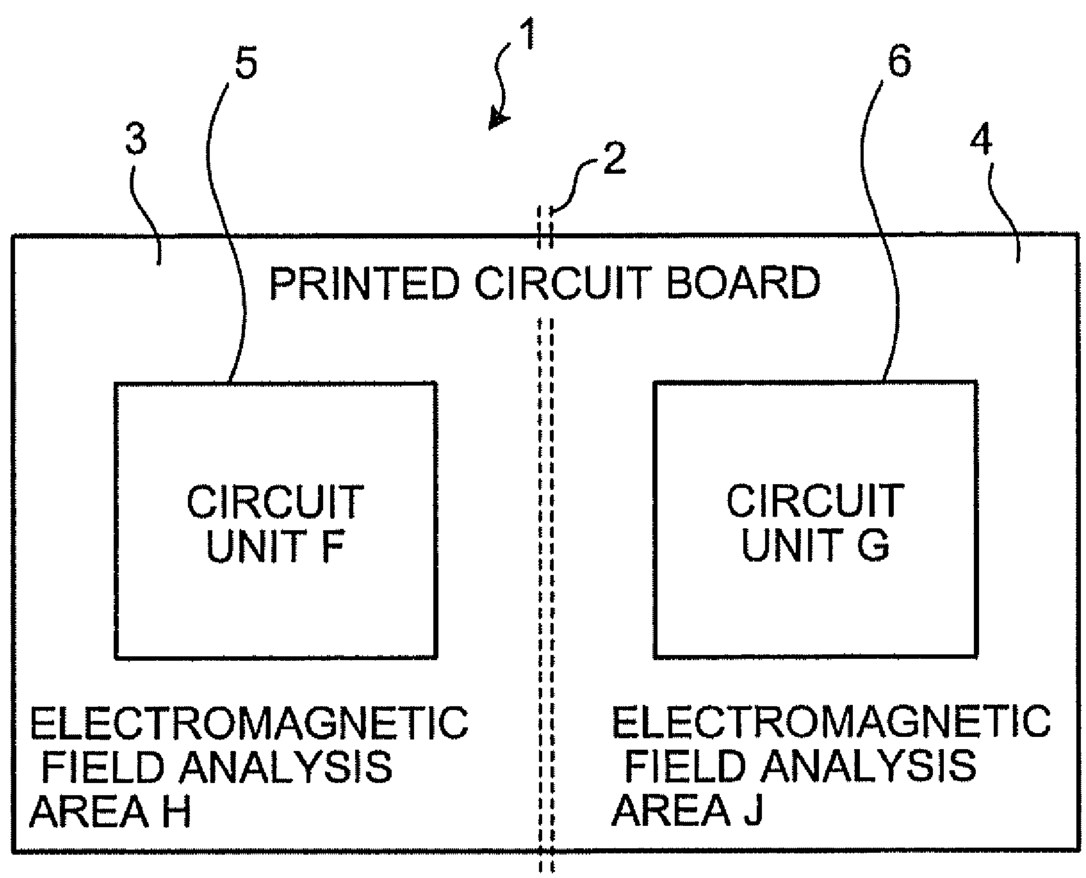
FIG. 11 is a diagram of a conventional configuration of an area that is to be analyzed.
Figure 13:
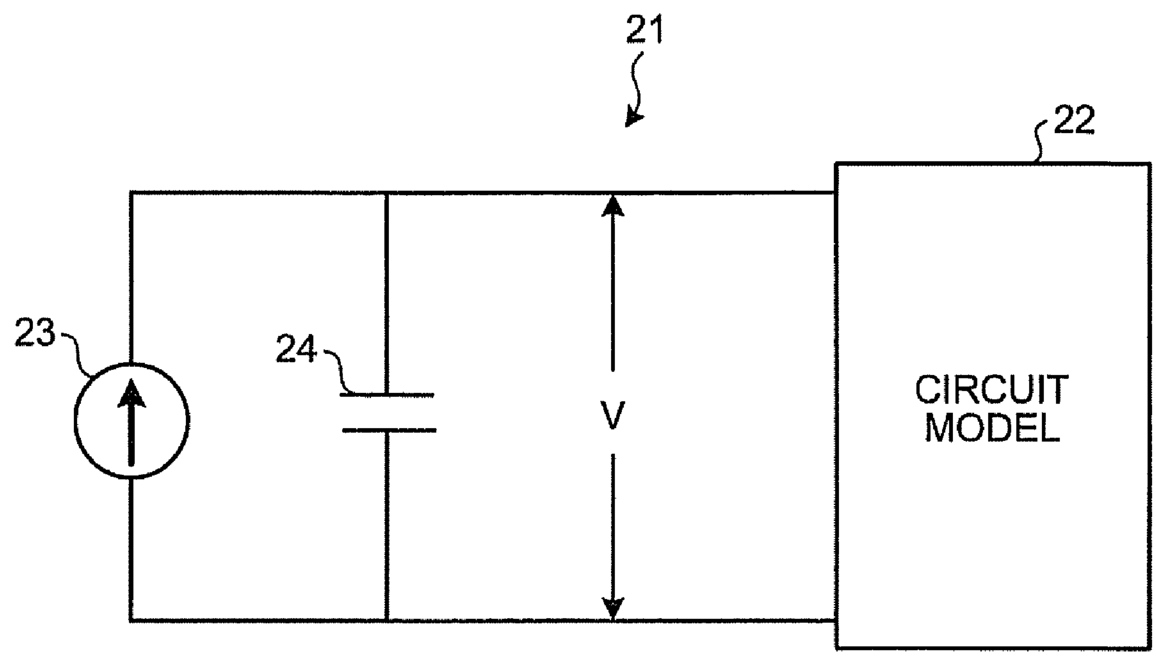
FIG. 13 is a diagram of a configuration of an equivalent circuit of a circuit unit employing a current source method.

FIG. 8 is a diagram of a configuration of an area to be analyzed that has been divided for an integrated simulation method, according to a second embodiment. As depicted in FIG. 8, in the second embodiment, the circuit unit 35 is divided into circuit blocks K36 and L37. The dividing method for obtaining the circuit blocks K36 and L37, which are areas subject to circuit analysis, is not dependent on the dividing method for the electromagnetic field analysis areas H33 and J34, which are subject to electromagnetic field analysis.

FIG. 9 is a diagram of a configuration of a simulation system according to the second embodiment of the present invention. In the analysis of an area having a configuration as depicted in FIG. 8, as depicted in FIG. 9, the processing apparatuses D44 and E71 are responsible for circuit analysis with respect to the circuit blocks k36 and L37, respectively. The processing apparatuses D44 and E71, through a network, are connected and are further connected to the processing apparatus C43, all of which mutually communicate data.

The processing apparatus C43 receives the voltage (V) of the equivalent circuit from each of the processing apparatuses D44 and E71 and creates the circuit cell information table 53 that aggregates the received voltages. Based on the position/connection information data 54 of the circuit cell, the circuit-cell-data aggregating unit 52 selects data for the circuit analysis by the processing apparatus D44 from the circuit cell information table 53 and transmits the selected data to the processing apparatus D44 and further selects data for the circuit analysis by the processing apparatus E71 from the table 53 and transmits the selected data to the processing apparatus E71.

The processing apparatus D44 includes a circuit analyzing unit Da55. Based on a netlist M73 of the circuit block K, the circuit analyzing unit Da55 solves a circuit equation of the netlist. The processing apparatus E71 includes a circuit analyzing unit Ea72. Based on a netlist N74 of the circuit block L, the circuit analyzing unit Ea72 solves a circuit equation of the netlist. The circuit analyzing units Da55 and Ea72 exchange data of the connecting portion between the circuit blocks K36 and L37.

FIG. 10 is a diagram of a configuration of a circuit cell information table of the simulation system according to the second embodiment of the present invention. As depicted in FIG. 10, in the second embodiment, the netlist connection information field 65 of the circuit cell information table 53 stores therein information for determining a netlist connected with the equivalent circuit (netlist M, netlist N).

This netlist determination information enables, with respect to the circuit cell in the circuit block K36, data to be exchanged between the circuit analyzing unit Da55 and the electromagnetic field analyzing unit Aa45 that implement the netlist of the circuit block K, the data being exchanged by way of the circuit-cell-data aggregating unit 52. Similarly, data exchange may be executed for the circuit cell in the circuit block L37.

A hardware configuration of the processing apparatus E71 is depicted in FIG. 4. Other configurations of the processing apparatus E71 are identical to those of the first embodiment. Redundant description of configurations identical to those of the first embodiment will be omitted. Operation of the processing apparatus E71 is identical to the circuit analyzing process of the processing apparatus D44 depicted in FIG. 7. However, at step S35 of FIG. 7, the circuit analyzing units Da55 and Ea72 mutually exchange data of the connecting portion between the circuit blocks K36 and L37 when the circuit analyzing units Da55 and Ea72 respectively solve the circuit equation of the netlist.

According to the second embodiment, data obtained by the electromagnetic field analyzing units Aa45 and Ba47 are aggregated to the circuit-cell-data aggregating unit 52 and data for the respective circuit analysis by the circuit analyzing units Da55 and Ea72 is transmitted from the circuit-cell-data aggregating unit 52 to the circuit analyzing units Da55 and Ea72, respectively. Therefore, the circuit unit 35 may be divided into the circuit blocks K36 and L37 independent of the space division for the FDTD method. Thus, the division may be executed by determining blocks so that signal lines between the blocks are minimized.

For example, the number of signal lines needed for data communication between the circuit blocks k36 and L37 may be suppressed to several dozen and therefore, the communication time period between the circuit analyzing units Da55 and Ea72 may be short without the occurrence of a bottle neck. Whereas, for the configuration of the analysis area depicted in FIG. 8, when the circuit unit 35 of about 5 mm×5 mm is divided by the dividing border 32 that divides the circuit unit 35 into the electromagnetic field analysis areas H33 and J34 without regard for the circuit blocks K36 and L37, the number of signal lines needed for mutual data communication may be about fifty thousand.

In this case, when the circuit analyzing units Da55 and Ea72 each solve the circuit equation using, for example, a divided circuit analyzing approach, such as a diakoptics method, the circuit analyzing units Da55 and Ea72 need to transmit and receive therebetween at least fifty thousand data items twice per one iteration. Assuming that three iterations are executed at each time until the convergence, 0.3 million data items need to be communicated at each time.

Assuming one data item is eight bytes, the amount of data communicated at one time is 2.4 million bytes (19.2 million bits). Assuming that the average communication speed is about 10 Mbps, the data communication at each time takes about 1.8 seconds. In the FDTD method, analysis is executed at time intervals of about 50 fs. Therefore, when analysis is executed for a time period of 10 ns, the time period for the communication between the circuit analyzing units Da55 and Ea72 alone takes 100 hours and a serious bottle neck occurs. Therefore, this is not practical.

Herein, the present invention is not limited to the above first and second embodiments and may be variously altered. For example, the voltage value/current value exchanging units Ab46 and Bb48 may be provided on a processing apparatus responsible for the data aggregation, or may be provided on a processing apparatus responsible for the circuit analysis. Alternatively, the processing apparatus responsible for the data aggregation may be omitted and a function equivalent to such a processing apparatus may be provided on a processing apparatus responsible for electromagnetic field analysis or a processing apparatus responsible for circuit analysis.

When the netlist of the circuit unit 35 includes plural independent netlists that have no connection relations with each other, plural processing apparatuses that correspond to the circuits described by the netlists may be provided as a processing apparatus responsible for data aggregation, and data for each independent netlist having no connection relations with other netlists may be aggregated. Alternatively, the processing apparatus responsible for data aggregation may obtain the in-space position information of the circuit cells and connection information in the netlists through communication with the processing apparatuses responsible for electromagnetic field analysis and circuit analysis, instead of reading out information.

The processing apparatuses A41, B42, C43, D44, and E71 may be computers other than those depicted in FIG. 4 and two or more of the processing apparatuses A41, B42, C43, D44, and E71 may be CPUs incorporated in a computer that has plural CPUs in a single housing. The number of the processing apparatuses respectively responsible for electromagnetic field analysis and circuit analysis are not limited to the above examples.

According to the embodiments, data obtained by the electromagnetic field analyzing units are transmitted to the circuit analyzing unit through the aggregating unit. Data obtained by the circuit analyzing unit are transmitted to the electromagnetic field analyzing units through the aggregating unit. Therefore, even when the circuit unit spans plural electromagnetic field analysis areas due to the space division, the circuit analyzing unit may execute the circuit analysis without dividing the circuit unit.

According to the embodiments, an integrated simulation method employing parallel processing may be efficiently executed even when a circuit unit spans plural electromagnetic field analysis areas due to the space division of an FDTD method.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A simulation system comprising:

a plurality of electromagnetic field analyzing units that execute electromagnetic field analysis with respect to a plurality of electromagnetic field analysis areas obtained by division of an area to be analyzed into the electromagnetic field analysis areas;

one or more circuit analyzing units that execute circuit analysis with respect to a circuit unit, which is to be analyzed with the circuit analysis different from the electromagnetic field analysis and includes a circuit element, in the area to be analyzed, the circuit unit being disposed so as to span a boundary between at least two of the plurality of electromagnetic field analysis areas and expand consecutively to each of the at least two of the plurality of electromagnetic field analysis areas which are not overlapped each other; and an aggregating unit that aggregates, from the electromagnetic field analyzing units, data for the circuit analysis by the one or more circuit analyzing units and transmits the data to the one or more circuit analyzing units, wherein the simulation system links a plurality of processing units that mutually exchange data.

2. The simulation system according to claim 1, wherein the aggregating unit receives from the one or more circuit analyzing units, data for the electromagnetic field analysis by the electromagnetic field analyzing units and transmits to an electromagnetic field analyzing unit among the electromagnetic field analyzing units, the data relevant to the electromagnetic field analysis executed by the electromagnetic field analyzing unit.

3. The simulation system according to claim 2, wherein the electromagnetic field analyzing units, the one or more circuit analyzing units, and the aggregating unit are distributed among a plurality of processing apparatuses that are connected through a network.

4. The simulation system according to claim 3, wherein the aggregating unit is provided on a processing apparatus that is among the processing apparatuses and is the processing apparatus on which an electromagnetic field analyzing unit is provided.

5. The simulation system according to claim 3, wherein the aggregating unit is provided a processing apparatus that is among the processing apparatuses and is the processing apparatus on which a circuit analyzing unit is provided.

6. The simulation system according to claim 2, wherein the data transmitted and received between the electromagnetic field analyzing units and the one or more circuit analyzing units through the aggregating unit include capacity data, current data, and voltage data for an equivalent circuit, the capacity data, the current data, and the voltage data for the equivalent circuit being used to integrate a finite difference time domain method and the circuit analysis, and the electromagnetic field analyzing units convert the voltage data into electric field data and convert magnetic field data into the current data.

7. The simulation system according to claim 2, wherein the data transmitted and received between the electromagnetic field analyzing units and the one or more circuit analyzing units through the aggregating unit include capacity data of an equivalent circuit, electric field data of a cell that is for a finite difference time domain method and includes a circuit, and magnetic field data concerning a magnetic field around the cell, the capacity data, the electric field data and the magnetic field data being used to integrate the finite difference time domain method and the circuit analysis, and the one or more circuit analyzing units convert voltage data into the electric field data and convert the magnetic field data into current data.

8. The simulation system according to claim 2, wherein the data transmitted and received between the aggregating unit and the electromagnetic field analyzing units include capacity data of an equivalent circuit, electric field data of a cell that is for a finite difference time domain method and includes a circuit, and magnetic field data concerning a magnetic field around the cell, the capacity data, the electric field data, and the magnetic field data being used to integrate the finite difference time domain method and the circuit analysis, the data transmitted and received between the aggregating unit and the one or more circuit analyzing units include capacity data, current data, and voltage data of an equivalent circuit, the capacity data, the current data, and the voltage data of the equivalent circuit being used to integrate the finite difference time domain method and the circuit analysis, and the aggregating unit converts the voltage data into the electric field data and converts the magnetic field data into the current data.

9. A simulation system comprising:

a plurality of electromagnetic field analyzing units that execute electromagnetic field analysis with respect to a plurality of electromagnetic field analysis areas obtained by division of an area to be analyzed into the electromagnetic field analysis areas;

a plurality of circuit analyzing units that execute circuit analysis with respect to a plurality of circuit blocks, each of which is to be analyzed with the circuit analysis different from the electromagnetic field analysis and includes a circuit element, obtained by division of a circuit unit into the circuit blocks, the circuit unit being in the area to be analyzed, and the division being based on a circuit netlist, at least one of the plurality of circuit blocks being disposed so as to span a boundary between at least two of the plurality of electromagnetic field analysis areas and expand consecutively to each of the at least two of the plurality of electromagnetic field analysis areas which are not overlapped each other; and an aggregating unit that aggregates, from the electromagnetic field analyzing units, data for the circuit analysis by the circuit analyzing units and transmits to a circuit analyzing unit among the circuit analyzing units, the data relevant to the circuit analysis executed by the circuit analyzing unit, wherein the simulation system links a plurality of processing units that mutually exchange data.

10. The simulation system according to claim 9, wherein the aggregating unit receives from the circuit analyzing units, data for the electromagnetic field analysis by the electromagnetic field analyzing units and transmits to an electromagnetic field analyzing unit among the electromagnetic field analyzing units, the data relevant to the electromagnetic field analysis executed by the electromagnetic field analyzing unit.

11. The simulation system according to claim 10, wherein the electromagnetic field analyzing units, the circuit analyzing units, and the aggregating unit are distributed among a plurality of processing apparatuses that are connected through a network.

12. The simulation system according to claim 11, wherein the aggregating unit is provided on a processing apparatus that is among the processing apparatuses and is the processing apparatus on which an electromagnetic field analyzing unit is provided.

13. The simulation system according to claim 11, wherein the aggregating unit is provided a processing apparatus that is among the processing apparatuses and is the processing apparatus on which a circuit analyzing unit is provided.

14. The simulation system according to claim 10, wherein the data transmitted and received between the electromagnetic field analyzing units and the circuit analyzing units through the aggregating unit include capacity data, current data, and voltage data for an equivalent circuit, the capacity data, the current data, and the voltage data for the equivalent circuit being used to integrate a finite difference time domain method and the circuit analysis, and the electromagnetic field analyzing units convert the voltage data into electric field data and convert magnetic field data into the current data.

15. The simulation system according to claim 10, wherein the data transmitted and received between the electromagnetic field analyzing units and the circuit analyzing units through the aggregating unit include capacity data of an equivalent circuit, electric field data of a cell that is for a finite difference time domain method and includes a circuit, and magnetic field data concerning a magnetic field around the cell, the capacity data, the electric field data and the magnetic field data being used to integrate the finite difference time domain method and the circuit analysis, and the circuit analyzing units convert voltage data into the electric field data and convert the magnetic field data into current data.

16. The simulation system according to claim 10, wherein the data transmitted and received between the aggregating unit and the electromagnetic field analyzing units include capacity data of an equivalent circuit, electric field data of a cell that is for a finite difference time domain method and includes a circuit, and magnetic field data concerning a magnetic field around the cell, the capacity data, the electric field data, and the magnetic field data being used to integrate the finite difference time domain method and the circuit analysis, the data transmitted and received between the aggregating unit and the circuit analyzing units include capacity data, current data, and voltage data of an equivalent circuit, the capacity data, the current data, and the voltage data of the equivalent circuit being used to integrate the finite difference time domain method and the circuit analysis, and the aggregating unit converts the voltage data into the electric field data and converts the magnetic field data into the current data.

17. A non-transitory computer-readable recording medium storing therein a simulation program causing a plurality of processing apparatuses to execute:

analyzing, by electromagnetic field analysis, a plurality electromagnetic field analysis areas obtained by division of an area to be analyzed into of the electromagnetic field analysis areas;

analyzing, by circuit analysis, a circuit unit, which is to be analyzed with the circuit analysis different from the electromagnetic field analysis and includes a circuit element, included in the area to be analyzed, the circuit unit being disposed so as to span a boundary between at least two of the plurality of electromagnetic field analysis areas and expand consecutively to each of the at least two of the plurality of electromagnetic field analysis areas which are not overlapped each other;

aggregating, from the analyzing by electromagnetic field analysis, data for the analyzing by circuit analysis; and transmitting the data aggregated at the aggregating to a processing apparatus executing the analyzing by circuit analysis, wherein the simulation program causes a plurality of processing units that mutually exchange data to be linked.

18. The non-transitory computer-readable recording medium according to claim 17, wherein the aggregating includes aggregating, from the analyzing by circuit analysis, data for the analyzing by electromagnetic field analysis, and the transmitting includes transmitting to a processing apparatus executing the analyzing by electromagnetic field analysis, the data relevant to the analyzing by electromagnetic field analysis executed by the processing apparatus.

19. A non-transitory computer-readable recording medium storing therein a simulation program causing a plurality of processing apparatuses to execute:

analyzing, by electromagnetic field analysis, a plurality of electromagnetic field analysis areas obtained by division of an area to be analyzed into the electromagnetic field analysis areas;

analyzing, by circuit analysis, a plurality of circuit blocks, each of which is to be analyzed with the circuit analysis different from the electromagnetic field analysis and includes a circuit element, obtained by division of a circuit unit into the circuit blocks, the circuit unit being included in the area to be analyzed, and the division being based on a circuit netlist, at least one of the plurality of circuit blocks being disposed so as to span a boundary between at least two of the plurality of electromagnetic field analysis areas and expand consecutively to each of the at least two of the plurality of electromagnetic field analysis areas which are not overlapped each other;

aggregating, from the analyzing by electromagnetic field analysis, data for the analyzing by circuit analysis; and transmitting the data aggregated at the aggregating to a processing apparatus executing the analyzing by circuit analysis, the data relevant to the analyzing by circuit analysis executed by the processing apparatus, wherein the simulation program causes a plurality of processing units that mutually exchange data to be linked.

20. A non-transitory computer-readable recording medium storing therein a simulation program causing a processing apparatus to execute:

receiving, from a plurality of electromagnetic field analyzing units that execute electromagnetic field analysis, data for circuit analysis by one or more circuit analyzing units that execute the circuit analysis;

transmitting to the one or more circuit analyzing units, the data received at the receiving from the electromagnetic field analyzing units;

receiving, from the one or more circuit analyzing units, data for the electromagnetic field analysis by the electromagnetic field analyzing units; and transmitting to the electromagnetic field analyzing units, the data received at the receiving from the one or more circuit analyzing units wherein, the simulation program is executed when the electromagnetic field analysis is to be executed with respect to a plurality of electromagnetic field analysis areas obtained by division of an area to be analyzed, the circuit analysis is to be executed with respect to a circuit unit, which is to be analyzed with the circuit analysis different from the electromagnetic field analysis and includes a circuit element, included in the area to be analyzed, the circuit unit being disposed so as to span a boundary between at least two of the plurality of electromagnetic field analysis areas and expand consecutively to each of the at least two of the plurality of electromagnetic field analysis areas which are not overlapped each other, and a plurality of processing units that mutually exchange data are linked.

* * * * *